(12) United States Patent
Wiber

(10) Patent No.: US 8,011,222 B2
(45) Date of Patent: Sep. 6, 2011

(54) IMPACT DETECTION DEVICE

(75) Inventor: Laurent Wiber, Flines-lez-Raches (FR)

(73) Assignee: Decathlon, Villeneuve d'Ascq (FR)

( * ) Notice: Subject to any disclaimer, the term of this patent is extended or adjusted under 35 U.S.C. 154(b) by 0 days.

(21) Appl. No.: 12/345,712

(22) Filed: Dec. 30, 2008

(65) Prior Publication Data
US 2009/0176632 A1 Jul. 9, 2009

(30) Foreign Application Priority Data
Dec. 31, 2007 (FR) ...................... 07 60453

(51) Int. Cl.
*G01P 15/00* (2006.01)
*G01L 1/00* (2006.01)
*A63B 69/34* (2006.01)

(52) U.S. Cl. ............................ 73/12.09; 73/768; 482/84

(58) Field of Classification Search ................. 73/12.09, 73/12.04, 12.05, 768, 777, 862.53, 862.621, 73/862.624, 862.625, 862.627; 482/83–90
See application file for complete search history.

(56) References Cited

U.S. PATENT DOCUMENTS

| | | | | |
|---|---|---|---|---|
| 3,580,575 A | | 5/1971 | Speeth | |
| 3,933,354 A | * | 1/1976 | Goldfarb et al. | 482/4 |
| 4,088,315 A | * | 5/1978 | Schemmel | 482/4 |
| 4,824,107 A | * | 4/1989 | French | 273/454 |
| 4,974,833 A | | 12/1990 | Hartman et al. | |
| 5,921,896 A | * | 7/1999 | Boland | 482/83 |
| 6,012,822 A | * | 1/2000 | Robinson | 362/103 |
| 6,110,079 A | * | 8/2000 | Luedke et al. | 482/83 |
| 6,280,344 B1 | * | 8/2001 | Robb | 473/125 |
| 6,726,605 B2 | * | 4/2004 | Chen | 482/87 |
| 7,479,094 B1 | * | 1/2009 | Alexander | 482/83 |
| 7,625,319 B2 | * | 12/2009 | Kang et al. | 482/83 |
| 2003/0216228 A1 | * | 11/2003 | Rast | 482/84 |
| 2005/0212762 A1 | | 9/2005 | Pearcey | |
| 2005/0266967 A1 | * | 12/2005 | Considine et al. | 482/84 |
| 2005/0288159 A1 | * | 12/2005 | Tackett | 482/84 |
| 2006/0258515 A1 | * | 11/2006 | Kang et al. | 482/83 |
| 2007/0206373 A1 | | 9/2007 | Whiteside et al. | |
| 2007/0213182 A1 | * | 9/2007 | Anderson | 482/83 |
| 2007/0241919 A1 | * | 10/2007 | Valentini | 340/665 |
| 2008/0125293 A1 | * | 5/2008 | Ng | 482/84 |
| 2009/0102129 A1 | * | 4/2009 | Isoz et al. | 273/372 |

FOREIGN PATENT DOCUMENTS

| | | |
|---|---|---|
| CA | 1 203 258 A | 4/1986 |
| DE | 202 06 086 U1 | 9/2002 |
| FR | 2788990 A1 * | 8/2000 |
| WO | 00/74798 A2 | 12/2000 |
| WO | 2004/070336 A1 | 8/2004 |
| WO | 2005/049154 A2 | 6/2005 |

* cited by examiner

*Primary Examiner* — Lisa Caputo
*Assistant Examiner* — Jonathan Dunlap
(74) *Attorney, Agent, or Firm* — Ladas & Parry LLP

(57) ABSTRACT

An impact detection device, as well as a system that includes such a device for simulation of a combat sport, or more generally for use in a sport in which the user creates an impact by striking an adversary or an object. This device includes a sensor that detects an impact and its intensity, which is mounted on a printed circuit, together with an indicator that activates when the detector detects an impact and/or in order to indicate to a user that the user must generate an impact. The indicator is imbedded in a protective covering so that it is located near the surface of its embedding material. The indicating means are mounted directly on the printed circuit, so that the embedding material also covers the printed circuit and the sensor.

18 Claims, 1 Drawing Sheet

IMPACT DETECTION DEVICE

BACKGROUND

Figure 1:
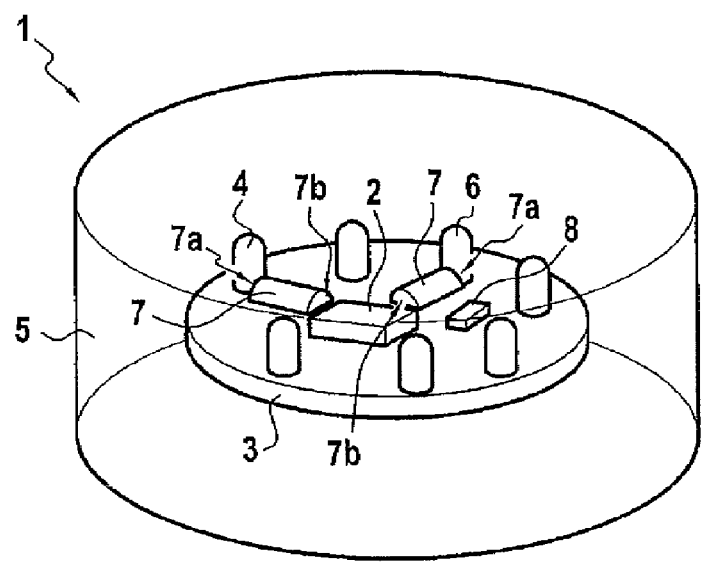

This present invention concerns an impact detection device, as well as a system that includes such a device. It is employed particularly in electronic training systems for a combat sport, or for simulation of such a combat sport, and in boxing, karate, kendo, or fencing in particular. More generally, the invention is employed in electronic training systems for a sport in which the user creates an impact by striking an adversary or a support, directly or by means of an object that is liable to transmit the impact.

Such systems necessitate the use of impact detection devices that are designed to detect an impact on a support as a result of a strike or a blow by the user onto this support.

In general, these impact detection devices are in fact used to detect the impact, and to record it in order possibly to display a result or a score on a screen.

However, such devices cannot be used to indicate, directly at the impact site, that the impact has indeed occurred. Moreover, they cannot be used to guide the user before impact, that is to indicate to the user where he should strike.

One is also aware, from document WO 2004/070336, of a punchbag for training in a combat sport, that includes an impact detection device.

This device includes a sensor of the piezoelectric type, designed to detect the strike, and an indicating element, of the digital display device type, associated with the sensor, the whole being mounted on a support that is attached to the punchbag.

The strike or the impact on the sensor is detected by this sensor, which transmits a detection signal directly to the indicating element, that is then activated (display of a value on the display device).

One of the drawbacks of such a device is that the indicating means are not located at the impact site. It is therefore not possible, with such a device, to design a use during which one indicates to the user the location at which he should apply the impact by activating the indicating means.

We are also aware, from document U.S. Pat. No. 4,974,833, of a system for the practice of a combat sport that includes a control unit connected to an impact detection device located at an impact site.

The impact detection device includes a sensor that is designed to detect an impact, and indicating means associated with the sensor.

The control unit is designed to receive a signal on the part of the impact detection device, indicating a strike in the area concerned, and possibly the force of this strike.

This control unit is also designed to emit a signal that is intended for the impact detection device, which activates the indicating means associated with the sensor, with the aim of indicating to the user that he should strike at a given location.

More precisely, the system includes an impact detection device. This impact detection device includes a sensor located at an impact site and designed to detect an impact in this zone, as well as indicating means.

The sensor is a vibrating cone of the loudspeaker type. It is mounted on a printed circuit board, in a cavity that is closed but perforated with holes for transmission of the vibrations.

The indicating means are LEDs, which are placed flush with the surface of the impact detection device, and preferably coated with silicone. A layer of the elastic synthetic foam type is placed around the LED. This layer is also placed between the LEDs and the surface, and between the cavity and the sensor.

Again we are aware, from document WO 2005/049154, of a target that includes an impact detection device mounted on a substrate, with a support for absorbing the energy of the device on the substrate.

This device includes a first sensor of the piezoelectric type on the target, and a second sensor of the piezoelectric type on the substrate.

Expressed otherwise, in this document, the sensor is mounted on one face of a plastic target disk, on the other face of which a printed circuit is mounted. Indicating means, in the form of diodes, are mounted in a circle on this printed circuit.

The face of the printed circuit on which the diodes are mounted, that is on the side opposite to the sensor, is covered with a sort of transparent dome.

However, neither in document U.S. Pat. No. 4,974,833 nor in document WO 2005/049154 is there any direct impact on the sensor.

In fact, in U.S. Pat. No. 4,974,833, a layer for transmission of the vibrations is also used to activate the sensor.

Furthermore, in WO 2005/049154, the pressure on the rigid support disk is communicated to the sensor only if this pressure is sufficient to crush the elastomer ring until it causes the sensor to press onto a second rigid support disk.

As a consequence, the detection of an impact is not sufficiently efficient and sensitive.

Finally, we are aware, from document U.S. Pat. No. 3,580,575, of a device in which a sensor and diodes are mounted in a circuit, with the whole being embedded in a protective resin, so that the diodes are located close to the surface of this embedding material.

This type of device cannot be used to obtain good accuracy in terms of information regarding the location of the impact, since the diffusion of the light emitted by the diodes within the embedding material does not allow one to see the impact with any accuracy. This is particularly important in the case where the device is employed in a network that includes a large number of such devices, some of which can be located close to each other.

The purpose of the invention is therefore to offer a solution to the aforementioned problems, amongst others.

The invention therefore refers, according to a first aspect, to an impact detection device, intended in particular to be used in an electronic training system for a combat sport.

This device includes at least one sensor, preferably of the piezoelectric type, designed in particular to detect an impact, and the intensity of this impact, and which is mounted on a printed circuit.

The device also includes indicating means that are designed to be activated when the sensor detects an impact and/or to indicate to a user that he should initiate an impact. These indicating means include at least one means for the emission of a light signal, of the electroluminescent diode type for example, and embedded in a protective embedding material and located close to the surface of this embedding material.

The indicating means are mounted directly on the printed circuit, with the embedding material also enclosing the printed circuit and the sensor.

Characteristically, the device also includes a channel for transmission to the sensor of the light signal emitted by the means for the emission of a light signal.

Thus, with the sensor and the indicating means placed at the same level on the printed circuit, and protected by the embedding material, it is possible to position this device so that it will directly receive the impact, and so that this impact will therefore be detected with precision and efficiency by the sensor.

In addition, the indicating means accurately indicate the impact site, with no danger of being damaged or causing injury to the user.

In a first variant, the indicating means include at least one first indicating means designed to be activated when the sensor detects an impact, and at least one second indicating means, separate from the first indicating means, and designed to be activated so as to tell a user that he should initiate an impact.

In a second variant, possibly in combination with the preceding one, the channel includes a tunnel, which can be in a plastic material such as opaque silicone. The means for the emission of a light signal is then placed at the entrance to or inside the tunnel, and the sensor is placed close to the exit from the tunnel.

In a second variant, possibly in combination with any one or more of the previous ones, the indicating means can include a large number of means for the emission of a light signal, preferably of the electroluminescent diode type, possibly distributed in a circle around the sensor, for example.

In yet another variant, possibly in combination with any one or more of the previous variants, the device includes means for the transmission and reception of a signal.

These means for the transmission and reception of a signal can be designed to emit a signal when the sensor detects an impact, with the emitted signal preferably being a function of the intensity of the impact, and to receive a signal for activation of the indicating means.

The embedding material can be composed of a material, of the silicone type for example, with a diffraction index such that the light signal, emitted by the means for the emission of a light signal, is diffused so as to be visible from the outside of the device.

In another variant, possibly in combination with any one or more of the previous ones, the embedding material also constitutes the outer envelope of the device.

In yet another variant, possibly in combination with any one or more of the previous ones, the embedding material is of more-or-less cylindrical form.

The invention also refers, according to a second aspect, to a system, in particular for the practice of a combat sport or training for a combat sport, such as boxing.

This system includes a main body that is intended to receive impacts on the part of a user.

Characteristically, the main body includes at least one impact detection device such as presented above.

In a first variant, the system includes a control unit.

This control unit includes means for the transmission and reception of a signal, and is designed to emit a signal that is intended for the impact detection device in order to activate the indicating means, and to receive a signal on the part of the impact detection device when an impact is detected by the latter.

The indicating means should preferably include means for the emission of a light signal of variable colour and/or of variable intensity, with the control unit being designed to activate the means for the emission of a light signal of a given colour and/or with a given intensity according to a given training sequence and/or a given action to be executed by the user.

In a second variant, possibly in combination with the preceding one, the main body constitutes a punchbag, for the practice of boxing for example.

This punchbag includes an outer envelope at least partially filled with padding.

The main body preferably includes an inner envelope, placed between the outer envelope and the padding, and the impact detection device is placed between these outer and inner envelopes.

Alternatively, the main body constituted a garment or one part of a garment, such as a garment for the practice of fencing for example.

The main body can also constitute an accessory to be worn on the body, such as a helmet, a glove or a shoe, or one part of this accessory.

BRIEF DESCRIPTION OF THE DRAWING FIGURES

Figure 2:
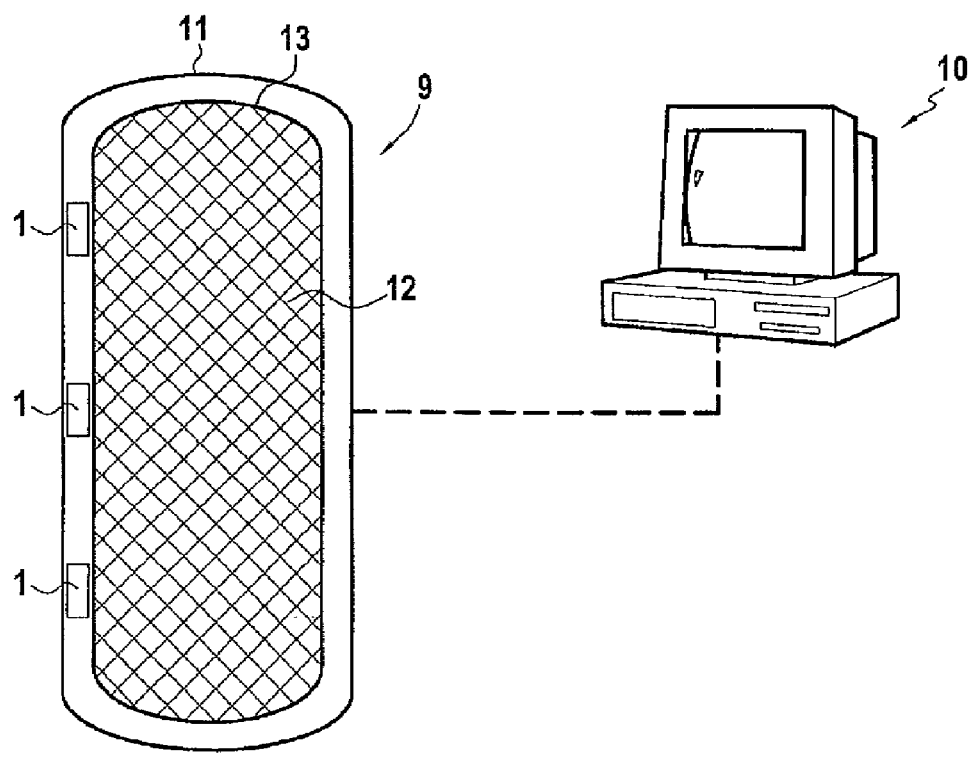

Other characteristics and advantages of the invention will appear more clearly and more fully on reading the description that follows of the preferred implementation variants, which are provided by way of non-limiting examples and with reference to the following appended drawings:

FIG. 1 schematically represents the impact detection device, in perspective and by transparency, FIG. 2 schematically represent a training system for a combat sport.

DETAILED DESCRIPTION

The impact detection device (1), as represented in FIG. 1, includes a printed circuit (3) on which a sensor (2) is mounted.

We preferably choose a sensor (2) of the piezoelectric type, for its ability to detect an impact as well as the force or the intensity of this impact, and to generate an electrical signal that is a function of this impact.

In order to increase the detection sensitivity, it is possible to arrange for several sensors (2) on the printed circuit (3).

On the printed circuit (3), indicating means (4, 6) are also mounted directly.

In the implementation example represented in FIG. 1, the indicating means (4, 6) are means for the emission of a light signal, of the electroluminescent type for example, such as LEDs.

These LEDs (4, 6) are distributed around the sensor (2), in such a manner that this sensor (2) is located approximately at the centre of the zone outlined by the LEDs (4, 6).

Other indicating means could be used instead of LEDs (4, 6), such as means for the emission of a sound signal that would be particularly suitable for use by visually impaired people.

The indicating means (4, 6) are designed to be activated when the sensor (2) detects an impact.

The sensor (2) in fact generates an electrical signal which then activates the LEDs (4, 6) via an electrical connection created on the printed circuit (3).

The indicating means (4, 6) can also or alternatively be designed to be activated from the outside of the device (1) and remotely by means of a control unit, for example (not shown in FIG. 1), so as to tell a user that he should initiate an impact in the area of the sensor (2).

Communication between the outside and the device can be a wire link, with the printed circuit (3) being connected to a control unit by means of a wired electrical connection for example.

Alternatively, wireless means for the transmission and reception (8) of a signal can be created on the printed circuits (3), which then communicate with the outside by wireless means.

Thus, these means (8) for the transmission and reception of a signal are designed to emit a signal to the exterior of the impact detection device (1) when the sensor (2) detects an impact, and to receive from the exterior of the impact detection device (1) a signal for activation of the indicating means (4, 6).

The signal emitted by the sensor (2) is preferably a function of the intensity of the impact on this sensor (2).

The printed circuit (3) on which the sensor (2) and the indicating means (4, 6) are therefore mounted directly is furthermore enclosed in an protective embedding material (5), such as a material of the silicone type for example.

In the example represented in FIG. 1, the embedding material (5) also constitutes the outer envelope of the impact detection device (1), and has the form of a cylinder or a puck.

The printed circuit (3) on which the sensor (2) and the indicating means (4, 6) are therefore mounted directly, is located in the upper part of this cylinder, in such a manner that both the indicating means (4, 6) and the sensor (2) are enclosed by the embedding material (5), and located close to its surface.

The indicating means (4, 6) can possibly be divided into two groups. A first group corresponds to first indicating means (4) that are designed to be activated when the sensor (2) detects an impact. A second group corresponds to second indicating means (6), separate from the first indicating means (4), which are designed to be activated so as to tell a user that he should initiate an impact in the area of the sensor (2).

The material employed for the embedding material (5) is preferably a material with a high diffraction index, of the silicone type for example. Thus, when the indicating means (4, 6) are means for the emission of a light signal, such as LEDs, as is the case in the example represented in FIG. 1, the light signals emitted by these LED (4, 6) are diffused in particular so as to be visible from the outside of the impact detection device (1).

Still in the case where the indicating means (4, 6) are means for the emission of a light signal, such as LEDs, channels (7) can be provided for diffusion of the light signal to the sensor (2).

The aim of these channels (7) is to concentrate all or part of the light signal emitted by the LEDs (4, 6) onto the sensor (2), and therefore to reduce the dispersion of the light signal in all directions.

These channels (7) can take the form of tunnels (7) in an opaque material (plastic, silicone, etc.) and are placed between the LEDs (4, 6) and the sensor (2).

More precisely, these tunnels (7) are placed in such a manner that the LEDs (4, 6) are located respectively at the entrance or close to the entrance of the tunnels (7). Alternatively, the tunnels (7) can be placed in such a manner that the LEDs (4, 6) are located inside these tunnels (7).

Furthermore, these tunnels (7) are placed in such a manner that the sensor (2) is located close to the exit from these tunnels (7).

In FIG. 2, the impact detection device, as presented above with reference to FIG. 1, is represented in one of its applications, namely a system for the practice of a combat sport such as boxing, or for training for such a combat sport.

Such a system includes a main body (9) that is intended to receive impacts on the part of the user, where this main body includes one or more impact detection devices (1).

The impact detection devices (1) are mounted in the main body (9) with their surface, close to which are located the sensor (2) and the indicating means (4, 6), oriented toward the user.

The impact detection devices (1) are connected to a control unit (10). This control unit (10) is designed to emit a signal that is intended for the impact detection device or devices (1), with the aim of activating all or part of the indicating means (4, 6).

This control unit is also designed to receive a signal on the part of the impact detection device or devices (1) when an impact is actually detected by these devices (1).

The signals emitted by the control unit (10) can possibly be used to activate means for the emission of a light signal of a given colour and/or of given intensity, in the case, for example, of the use of LEDs (4, 6) as the indicating means (4, 6), and more generally of means (4, 6) for the emission of a light signal of variable colour and/or of variable intensity.

The variability of the intensity can also be achieved by activating only a part of the LEDs (4, 6) of a given device (1).

Thus, it is possible to control the activation of these indicating means (4, 6) on the different impact detection devices (1) according to a given training sequence, or according to one or more specific actions that one wants to see executed by the user.

In the application for a combat sport such as boxing, the main body (9) can take the form of a punchbag (9).

This punchbag (9) includes an outer envelope (11) that is filled with padding (12).

The punchbag (9) is also equipped with an inner envelope (13), placed between the padding (12) and the outer envelope (11).

Thus, a space is created between the outer envelope (11) and the inner envelope (13), into which one or more impact detection devices (1) can be inserted.

In other variants (not shown), the main body can constitute a garment, or part of a garment, or indeed an accessory to be worn on the body (helmet, glove, shoe, etc.) or any part of this accessory.

Such a system then enables one to envisage interactive working between two adversaries with each wearing one or more accessories or garments as described above, and connected to the control unit.

A first adversary can thus see indicated a sequence of specific blows or actions with impact to be executed on a second adversary.

He is also able to check, by means of the control unit and/or the indicating means, whether he has correctly executed the proposed sequence.

All of the above description is given by way of examples only, and does not limit the invention.

It is therefore recalled in particular that the use of means for the emission of a light signal, such as LEDs, as the indicating means, is only an example, the aim being to enable the user to be informed of an impact that has occurred and/or to be executed in a given area.

The invention claimed is:

1. An impact detection device, intended in particular to be used in an electronic training system for a combat sport, that includes:
  at least one sensor, designed in particular to detect an impact, and the intensity of this impact, and to be mounted on a printed circuit,
  indicating means that include at least one means for the emission of a light signal, and that are designed to be activated when the sensor detects a first impact, and to indicate to a user that the user should initiate a second impact, with these indicating means being mounted directly on the printed circuit, embedded in a protective embedding material, and located close to the surface of the embedding material, where the embedding material also embeds the printed circuit and the sensor wherein, the device also includes a channel for transmission to the sensor of the light signal emitted by the means for the emission of said light signal.

2. A device according to claim 1, wherein the indicating means include at least one first indicating means designed to be activated when the sensor detects the first impact, and at least one second indicating means, seperate from the first indicating means and designed to be activated so as to tell a user that the user should initiate the second impact.

3. A device according to claim 1 wherein, the channel includes a tunnel, the means for the emission of a light signal being located close to the entrance or inside of the tunnel, and the sensor being located close to the exit of the tunnel.

4. A device according to claim 1, wherein the indicting means include a plurality of means for the emission of a light signal distributed around the sensor.

5. A device according to claim 1, wherein a means for the transmission and reception of a signal is included.

6. A device according to claim 5, wherein the means for the transmission and reception of a signal emit a signal when the sensor detects a first impact, the signal emitted being a function of the intensity of the first impact, and receive a signal for activation of the indicating means.

7. A device according to claim 1, wherein the embedding material is made from a material with a diffraction index such that the light signal emitted by the means for the emission of a light signal is diffused so as to be visible from the outside of the device.

8. A device according to claim 1, wherein the embedding material also constitutes the outer envelope of the device.

9. A device according to claim 1, wherein the embedding material is substantially cylindrical.

10. A system for the practice of a combat sport or training for a combat sport, that includes a main body that is intended to receive impacts on the part of the user, wherein the main body includes at least one impact detection device according to claim 1.

11. A system according to claim 10, further comprising a control unit with means for the transmission and reception of a signal, the control unit emitting a signal to the impact detection device in order to activate the indicating means, and the control unit having a means to receive a signal from the impact detection device when a first impact is detected by the impact detection device.

12. A system according to claim 11, wherein the indicating means include means for the emission of at least one of a light signal of variable color or of variable intensity, the control unit being designed to activate the means for the emission of a at least one of light signal of a given color or with a given intensity according to at least one of a given training sequence or a given action to be executed by the user.

13. A system according to claim 10, wherein the main body constitutes a garment or part of a garment.

14. A system according to claim 10, wherein the main body constitutes an accessory to be worn on the body.

15. A system according to claim 10, wherein the main body constitutes a punchbag that includes an outer envelope that is at least partially filled with a padding.

16. A system according to claim 15, wherein the main body includes an inner envelope placed between the outer envelope and the padding, and in that the impact detection device is placed between these outer and inner envelopes.

17. An impact detection device according to claim 1, wherein the at least one sensor, designed in particular to detect an impact, and the intensity of this impact, and to be mounted on a printed circuit is of the piezoelectric type.

18. An impact detection device according to claim 1, wherein the indicating means that include at least one means for the emission of a light signal is of the electroluminescent diode type.

* * * * *